United States Patent
Watanabe

(10) Patent No.: US 7,538,999 B2
(45) Date of Patent: May 26, 2009

(54) SEMICONDUCTOR DEVICE HAVING ELECTROSTATIC PROTECTION CIRCUIT

(75) Inventor: Kentaro Watanabe, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/870,681

(22) Filed: Oct. 11, 2007

(65) Prior Publication Data

US 2008/0094767 A1 Apr. 24, 2008

(30) Foreign Application Priority Data

Oct. 18, 2006 (JP) ............................. 2006-284155

(51) Int. Cl.
| | |
|---|---|
| H02H 9/00 | (2006.01) |
| H02H 3/22 | (2006.01) |
| H02H 1/04 | (2006.01) |
| H02H 9/06 | (2006.01) |
| H02H 3/20 | (2006.01) |
| H02H 9/04 | (2006.01) |

(52) U.S. Cl. .......................... 361/56; 361/111; 361/118; 361/91.1

(58) Field of Classification Search ....................... None
See application file for complete search history.

(56) References Cited

U.S. PATENT DOCUMENTS

| | | | |
|---|---|---|---|
| 6,369,994 B1 * | 4/2002 | Voldman ..................... 361/56 |
| 6,765,772 B2 | 7/2004 | Lee et al. | |
| 6,958,896 B2 * | 10/2005 | Lin et al. ....................... 361/56 |
| 7,304,827 B2 * | 12/2007 | Chen et al. .................... 361/56 |
| 7,362,554 B2 * | 4/2008 | Austin et al. ................... 361/56 |
| 2004/0105201 A1 | 6/2004 | Wu et al. | |
| 2007/0047162 A1 | 3/2007 | Watanabe et al. | |

\* cited by examiner

*Primary Examiner*—Albert W Paladini
*Assistant Examiner*—Dharti H Patel
(74) *Attorney, Agent, or Firm*—Turocy & Watson, LLP

(57) ABSTRACT

This invention discloses a semiconductor device including a first buffer MOSFET of a first conductivity type, a second buffer MOSFET of a second conductivity type, an ESD protection circuit, an external input terminal, and a control circuit. The external input terminal capacitively couples to a terminal to which a second potential is applied, and receives the first potential or second potential in a normal operation mode. The control circuit includes a prebuffer which controls the gates of the first and second buffer MOSFETs on the basis of the potential of the external input terminal in the normal operation mode and fixes the external input terminal to the second or first potential by capacitive coupling upon ESD surge application, thereby fixing the gate of the second buffer MOSFET to the second or first potential and turning off the second buffer MOSFET.

20 Claims, 7 Drawing Sheets

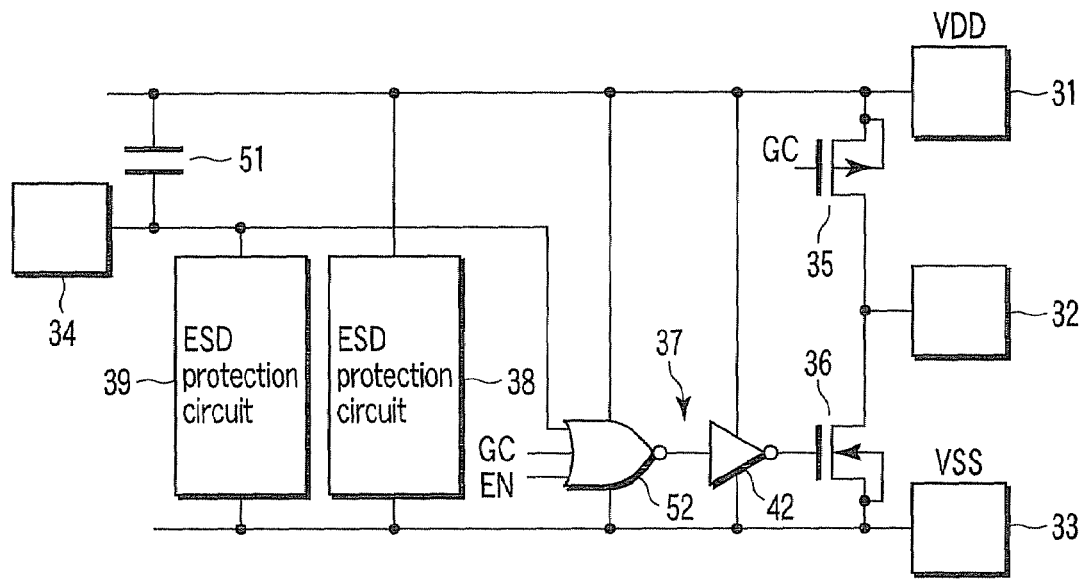
F I G. 7
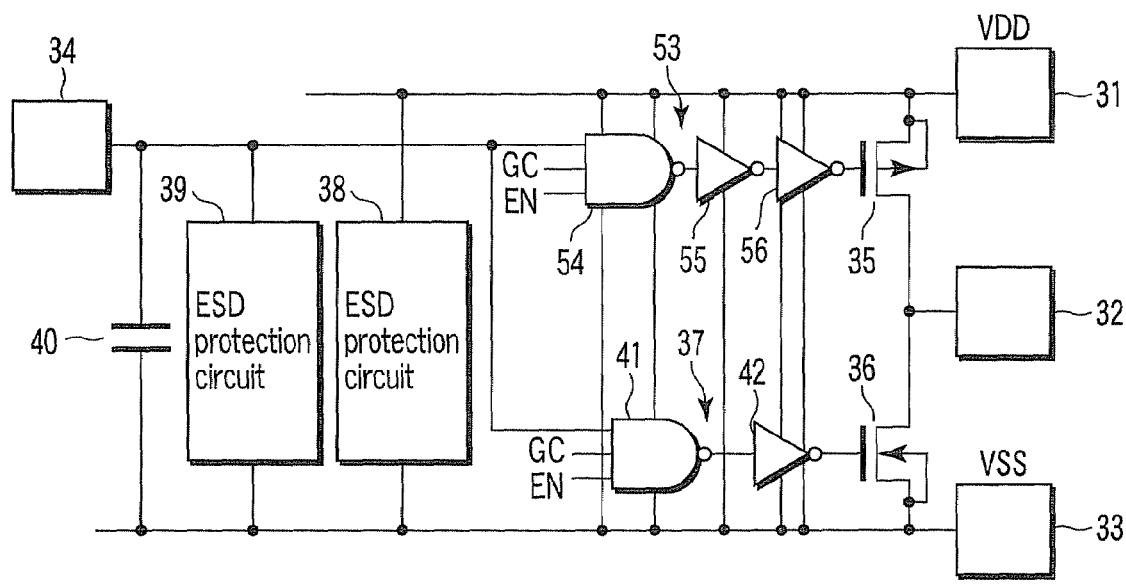
F I G. 8

SEMICONDUCTOR DEVICE HAVING ELECTROSTATIC PROTECTION CIRCUIT

CROSS-REFERENCE TO RELATED APPLICATIONS

This application is based upon and claims the benefit of priority from prior Japanese Patent Application No. 2006-284155, filed Oct. 18, 2006, the entire contents of which are incorporated herein by reference.

BACKGROUND OF THE INVENTION

1. Field of the Invention

The present invention relates to a semiconductor device having an electrostatic protection circuit for protecting the internal circuit from electrostatic breakdown.

2. Description of the Related Art

A semiconductor device such as an IC or LSI incorporates an electrostatic protection circuit to protect its internal circuit from an overcurrent such as an ESD (Electro Static Discharge) surge. To protect an internal circuit from an ESD surge input to an I/O terminal, for example, U.S. Pat. No. 6,765,772 proposes an ESD protection circuit using a GGNMOSFET (Grounded Gate N-channel MOSFET) and an SGPMOSFET (Source connected Gate P-channel MOSFET). The GGNMOSFET and SGPMOSFET have gates connected to a source and bulk (back gate) and are in an OFF state.

When an ESD surge is applied to the drain of the GGNMOSFET or SGPMOSFET, a BJT (Bipolar Junction Transistor) parasitic on the MOSFET is turned on to remove the ESD surge to the ground or power supply, though the MOSFET itself remains OFF. The parasitic BJT includes a drain serving as a collector, a source serving as an emitter, and a bulk serving as a base.

The parasitic BJT operates on the basis of the following principle. First, the ESD surge generates a high voltage in the junction on the drain side. This causes junction breakdown and flows a current to between the drain and the bulk. The base of the parasitic BJT is connected to the bulk via a well region having a relatively high resistance. Hence, the base is biased by an IR drop. The parasitic BJT is consequently turned on to remove the ESD surge.

When an I/O buffer has a GGNMOSFET and SGPMOSFET for ESD protection, their current paths are connected in parallel to those of a buffer NMOSFET and buffer PMOSFET included in the output buffer.

If an ESD surge is applied to the I/O terminal of this circuit arrangement, the gate potential of the MOSFET of the output buffer may rise to a level high enough to turn on the MOSFET. For example, assume that a positive ESD surge is applied to the I/O terminal. A buffer PMOSFET and SGPMOSFET are connected to the I/O terminal. A p-n junction diode is parasitic between the drain and bulk of the buffer PMOSFET or SGPMOSFET. For this reason, the power supply terminal connected to the bulk is stepped up to a positive potential. The logic circuit to control the I/O buffer is operable upon ESD surge application. The potential of the control signal of the logic circuit is indefinite. Hence, the gate potential may rise and turn on the buffer MOSFET upon surge application, depending on the arrangement of the logic circuit.

When the gate potential is given, and the ESD surge steps up the drain of the buffer NMOSFET, the parasitic BJT of the buffer NMOSFET is turned on at a drain voltage lower than that of the GGNMOSFET and SGPMOSFET (these MOSFETs have gate potentials that turn them off). This is because the inverted drain current of the MOSFET is superimposed on the emitter current of the parasitic BJT. As described above, if the buffer NMOSFET operates as a discharge device at a potential lower than that that makes the GGNMOSFET and SGPMOSFET operate as discharge devices, the current concentrates at the buffer NMOSFET, and no sufficient breakdown voltage can be ensured.

As a measure, U.S. Pat. No. 6,765,772 described above proposes a circuit that causes a diode string (voltage detecting device) to detect an increase in power supply voltage caused by an ESD surge and fixes the gate of the buffer NMOSFET to a low level through a switching circuit and driving circuit, thereby forcibly turning off the buffer NMOSFET. U.S. Patent Application Publication No. 2004/0105201A1 also describes a measure based on the same concept.

However, as the degree of integration increases, and the power supply voltage decreases, the breakdown voltage of each MOSFET included in the internal circuit becomes low. It is therefore difficult to sufficiently protect the internal circuit by the ESD protection circuit. A semiconductor device capable of effectively protecting the internal circuit from electrostatic breakdown is therefore in demand.

BRIEF SUMMARY OF THE INVENTION

According to an aspect of the present invention, there is provided a semiconductor device comprising a first terminal which receives a first potential, a second terminal which receives a second potential different from the first potential, an I/O terminal which inputs/outputs data, a first buffer MOSFET of a first conductivity type, which has a current path connected between the first terminal and the I/O terminal and drives the I/O terminal by the first potential, a second buffer MOSFET of a second conductivity type, which has a current path connected between the I/O terminal and the second terminal and drives the I/O terminal by the second potential, a first ESD protection circuit configured to protect an internal circuit from an ESD surge, an external input terminal which capacitively couples to one of the second terminal and the first terminal and receives one of the first potential and the second potential in a normal operation mode, and a control circuit including a first prebuffer which is configured to receive a signal that controls a gate potential of each of the first buffer MOSFET and the second buffer MOSFET, control a gate of each of the first buffer MOSFET and the second buffer MOSFET to a potential corresponding to the signal in the normal operation mode on the basis of one of the first potential and the second potential applied to the external input terminal, and fix the external input terminal to one of the second potential and the first potential by capacitive coupling upon ESD surge application, thereby fixing the gate of the second buffer MOSFET to one of the second potential and the first potential and turning off the second buffer MOSFET.

According to another aspect of the present invention, there is provided a protection circuit comprising a first terminal which receives a first potential, a second terminal which receives a second potential different from the first potential, a first ESD protection circuit connected between the first terminal and the second terminal, an external input terminal which capacitively couples to one of the second terminal and the first terminal and receives one of the first potential and the second potential in a normal operation mode, and a trigger circuit which is connected to the external input terminal, disables the first ESD protection circuit on the basis of one of the first potential and the second potential applied to the external input terminal in the normal operation mode, and fix the external input terminal to one of the second potential and the first potential by capacitive coupling upon ESD surge application, thereby giving a trigger to the first ESD protection circuit and operating the first ESD protection circuit.

According to a further aspect of the present invention, there is provided a semiconductor device comprising a power supply terminal which receivers a power supply potential, a reference potential terminal which receives a reference potential, an I/O terminal which inputs/outputs data, a power supply interconnection connected to the power supply terminal and a reference potential interconnection connected to the reference potential terminal, each of the power supply interconnection and the reference potential interconnection being arranged along a periphery of a chip, a buffer circuit which is connected to the power supply interconnection and the reference potential interconnection and drives the I/O terminal on the basis of a voltage between the power supply potential and the reference potential, a first ESD protection circuit connected to the power supply interconnection and the reference potential interconnection and configured to protect the buffer circuit from an ESD surge applied to the I/O terminal, a second ESD protection circuit connected to the power supply interconnection and the reference potential interconnection and configured to protect an internal circuit from an ESD surge applied to the power supply terminal and the reference potential terminal, an external input terminal connected to an interconnection arranged along the periphery of the chip, the external input terminal capacitively coupling to one of the reference potential terminal and the power supply interconnection and receiving one of the power supply potential and the reference potential in a normal operation mode, a control circuit connected to the external input terminal and configured to control the buffer circuit to a potential corresponding to a control signal on the basis of one of the power supply potential and the reference potential applied to the external input terminal in the normal operation mode and fix the external input terminal to one of the reference potential and the power supply potential by capacitive coupling upon ESD surge application, thereby fixing the buffer circuit to one of the reference potential and the power supply potential and disabling the buffer circuit, and a trigger circuit connected to the external input terminal and configured to disable the second ESD protection circuit on the basis of one of the power supply potential and the reference potential applied to the external input terminal in the normal operation mode, and fix the external input terminal to one of the reference potential and the power supply potential by capacitive coupling upon ESD surge application, thereby giving a trigger to the second ESD protection circuit and operating the second ESD protection circuit.

BRIEF DESCRIPTION OF THE SEVERAL VIEWS OF THE DRAWING

FIG. 7 is a circuit diagram showing an electrostatic protection circuit and its peripheral circuits so as to explain a first modification of the semiconductor device according to the second embodiment of the present invention;

FIG. 8 is a circuit diagram showing an electrostatic protection circuit and its peripheral circuits so as to explain a second modification of the semiconductor device according to the second embodiment of the present invention;

DETAILED DESCRIPTION OF THE INVENTION

First Embodiment

Figure 1:
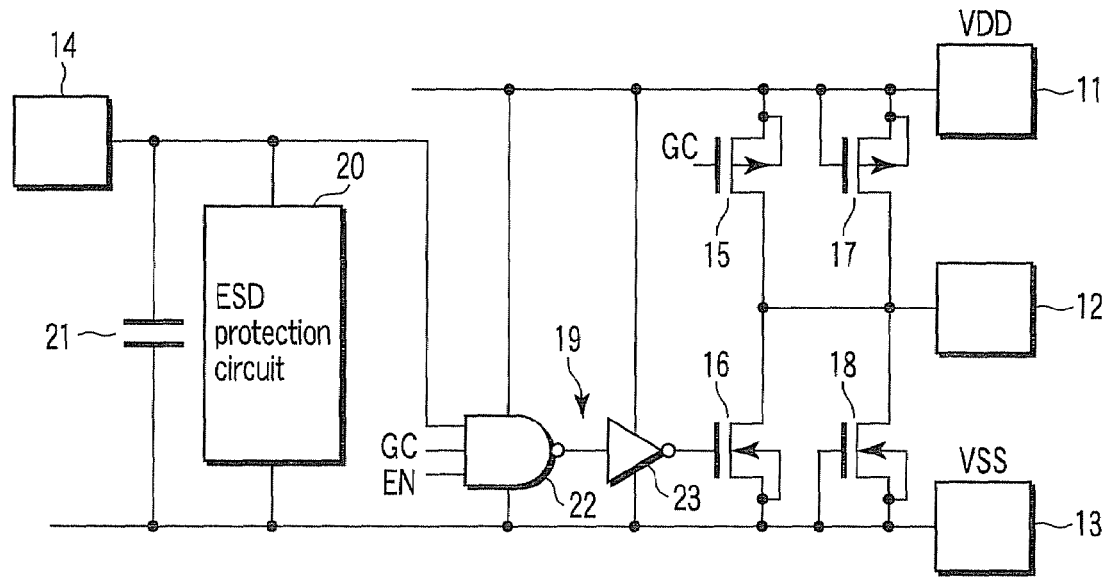
FIG. 1 is a circuit diagram showing an electrostatic protection circuit and its peripheral circuits so as to explain a semiconductor device according to the first embodiment of the present invention.

FIG. 1 is a circuit diagram showing an electrostatic protection circuit and its peripheral circuits so as to explain a semiconductor device according to the first embodiment of the present invention. FIG. 1 places focus on an output buffer. This circuit includes a power supply terminal (VDD terminal) 11, I/O terminal 12, reference potential terminal (VSS terminal) 13, external input terminal 14, buffer PMOSFET 15, buffer NMOSFET 16, SGPMOSFET 17, GGNMOSFET 18, prebuffer 19, ESD protection circuit 20, and capacitive element 21.

A power supply potential VDD is applied to the power supply terminal (power supply pad) 11. A reference potential VSS is applied to the reference potential terminal (reference potential pad) 13. The I/O terminal (I/O pad) 12 inputs/outputs data. The buffer PMOSFET 15 and buffer NMOSFET 16 form an output buffer. The current path between the source and drain of the buffer PMOSFET 15 is connected between the power supply terminal 11 and the I/O terminal 12 to pull up the I/O terminal 12 to the power supply potential VDD. The current path between the source and drain of the buffer NMOSFET 16 is connected between the I/O terminal 12 and the reference potential terminal 13 to pull down the I/O terminal 12 to the reference potential VSS. The bulks (back gates) of the buffer PMOSFET 15 and buffer NMOSFET 16 are connected to their sources.

The current path of the SGPMOSFET 17 is connected in parallel to that of the buffer PMOSFET 15. The current path of the GGNMOSFET 18 is connected in parallel to that of the buffer NMOSFET 16. That is, the source, gate, and bulk (back gate) of the SGPMOSFET 17 are connected to the power supply terminal 11 while the drain is connected to the I/O terminal 12. The source, gate, and bulk (back gate) of the GGNMOSFET 18 are connected to the reference potential terminal 13 while the drain is connected to the I/O terminal 12.

The prebuffer 19 includes, e.g., a 3-input NAND circuit 22 and an inverter circuit 23. The prebuffer 19 serves as a control circuit to control the gate potential of the buffer NMOSFET 16. The external input terminal (external input pad) 14 is connected to the first input terminal of the 3-input NAND circuit 22. The second and third input terminals receive a gate potential control signal GC and an enable signal EN, respectively. The 3-input NAND circuit 22 supplies its output signal to the input terminal of the inverter circuit 23. The inverter circuit 23 supplies its output to the gate of the buffer NMOSFET 16. The 3-input NAND circuit 22 and inverter circuit 23 operate at a voltage between the power supply potential VDD applied to the power supply terminal 11 and the reference potential VSS applied to the reference potential terminal 13.

The gate potential control signal GC is also supplied to the gate of the buffer PMOSFET 15. The signal GC and enable signal EN are generated by, e.g., the internal circuit.

The external input terminal 14 capacitively couples to the reference potential terminal 13 via the capacitive element 21. In the normal operation mode, the power supply potential VDD is applied to the external input terminal 14. The ESD protection circuit 20 is connected between the external input terminal 14 and the reference potential terminal 13. The ESD protection circuit 20 protects the internal circuit (e.g., 3-input NAND circuit 22) from an ESD surge applied to the external input terminal 14 and therefore has a circuit arrangement capable of removing positive and negative ESD surges. The ESD protection circuit 20 includes, e.g., a GGNMOSFET.

In the above-described arrangement, the power supply potential VDD is applied to the external input terminal 14 in the normal operation mode. Hence, the prebuffer 19 controls the buffer NMOSFET 16 on the basis of the signal GC and enable signal EN. The buffer PMOSFET 15 is ON/OFF-controlled on the basis of the signal CC complementarily to the buffer NMOSFET 16.

When a positive ESD surge relative to, e.g., the reference potential terminal 13 is applied to the I/O terminal 12, the power supply terminal 11 is stepped up to a potential higher than the reference potential terminal 13 via a diode parasitic on the buffer PMOSFET 15. The level of the signal GC and enable signal EN is fixed to the power supply potential VDD, reference potential VSS, or an intermediate potential between them depending on the state of the circuit that generates these signals. Generally, the state to be set is unpredictable.

However, the external input terminal 14 is fixed to the reference potential VSS upon ESD surge application because it capacitively couples to the reference potential terminal 13. Upon receiving a signal of reference potential VSS from the external input terminal 14, the prebuffer 19 including the 3-input NAND circuit 22 and inverter circuit 23 fixes the gate of the buffer NMOSFET 16 to the source potential (reference potential VSS) and forcibly turns off the buffer NMOSFET 16. This equalizes the breakdown voltage of the buffer NMOSFET 16 with that of the GGNMOSFET 18.

When a negative ESD surge is applied, the parasitic diode of the SGPMOSFET 17 operates to lead the ESD surge to the power supply terminal 11 (power supply potential VDD), thereby protecting the internal circuit.

According to the above-described arrangement, in the normal operation mode, the gate potential of the buffer NMOSFET 16 is controlled on the basis of the signals GC and EN. Upon ESD surge application, the buffer NMOSFET 16 is forcibly turned off. In this state, the parasitic BJT of the GGNMOSFET 18 is turned on to lead the ESD surge to the reference potential terminal 13 (reference potential VSS).

As described above, the prebuffer 19 fixes the gate potential of the buffer NMOSFET 16 to the source potential upon ESD surge application. This prevents the buffer NMOSFET 16 from breaking down at a potential lower than that of the GGNMOSFET 18. It is therefore possible to effectively protect the internal circuit from electrostatic breakdown.

(First Modification)

Figure 2:
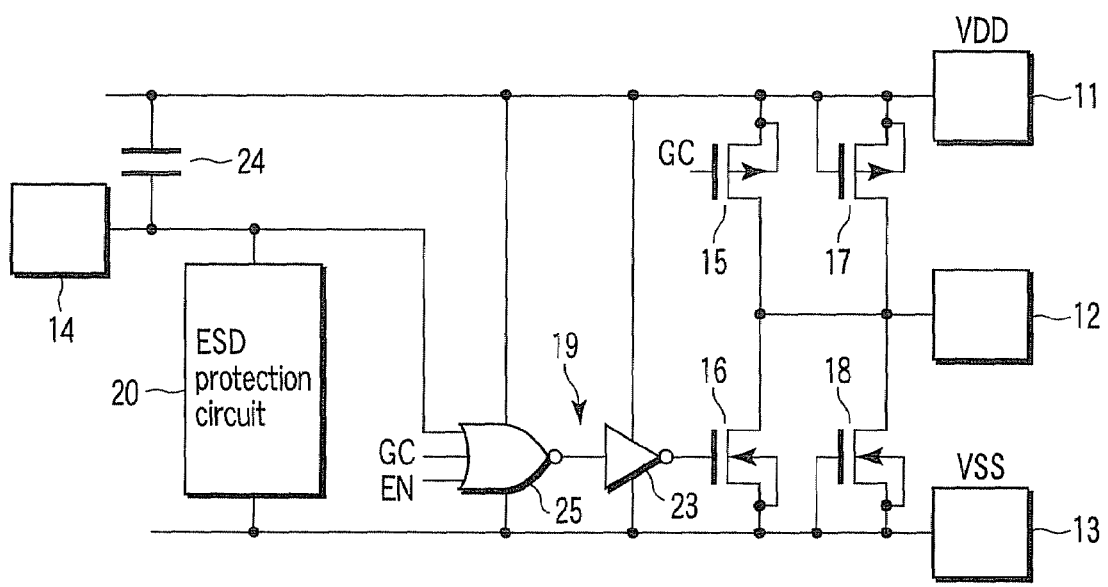
FIG. 2 is a circuit diagram showing an electrostatic protection circuit and its peripheral circuits so as to explain a first modification of the semiconductor device according to the first embodiment of the present invention.

FIG. 2 is a circuit diagram showing an electrostatic protection circuit and its peripheral circuits so as to explain a first modification of the semiconductor device according to the first embodiment of the present invention. In the first embodiment, the external input terminal 14 capacitively couples to the reference potential terminal 13 via the capacitive element 21. In the first modification, the external input terminal 14 capacitively couples to the power supply terminal 11 via a capacitive element 24. In the normal operation mode, the reference potential VSS is applied to the external input terminal 14. Additionally, a 3-input NOR circuit 25 is provided in place of the 3-input NAND circuit 22. That is, the prebuffer 19 includes the 3-input NOR circuit 25 and inverter circuit 23.

The remaining basic components are the same as in the first embodiment. The same reference numerals as in the first embodiment denote the same parts in this modification, and a detailed description thereof will not be repeated.

According to the above-described arrangement, in the normal operation mode, the reference potential VSS is applied to the external input terminal 14 so that the gate potential of the buffer NMOSFET 16 is controlled to a potential corresponding to the signals GC and EN. Upon ESD surge application, the external input terminal 14 is fixed to the power supply potential VDD because it capacitively couples to the power supply terminal 11. Accordingly, the gate of the buffer NMOSFET 16 is fixed to the source potential, and the buffer NMOSFET 16 is forcibly turned off. In this state, the parasitic BJT of the GGNMOSFET 18 is turned on to lead the ESD surge to the reference potential terminal 13 (reference potential VSS). This prevents the buffer NMOSFET 16 from breaking down at a potential lower than that of the GGNMOSFET 18.

It is therefore possible to fundamentally execute the same operation and actually obtain the same function and effect as in the first embodiment.

(Second Modification)

Figure 3:
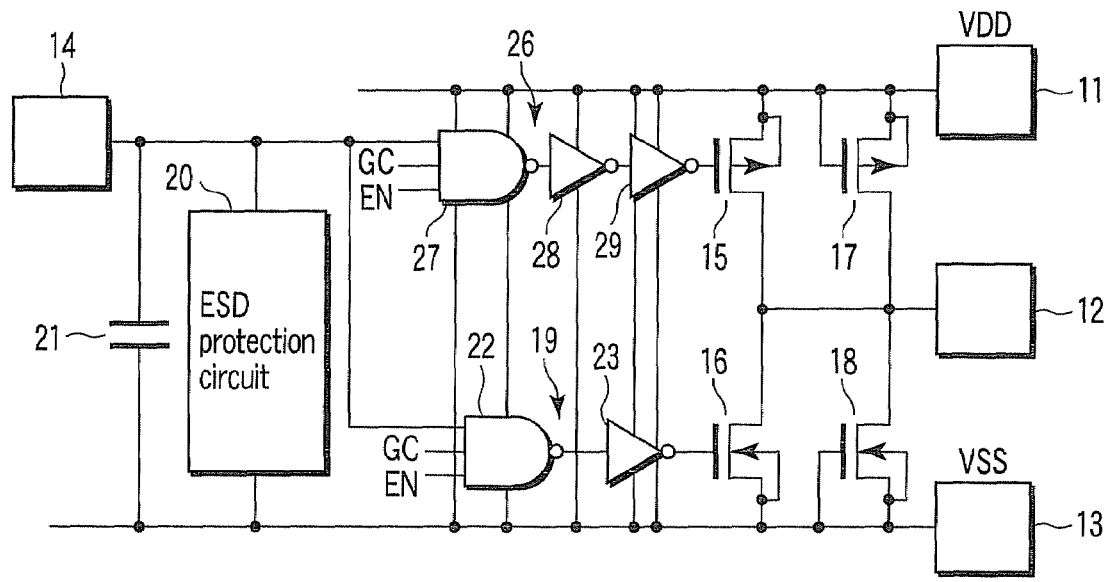
FIG. 3 is a circuit diagram showing an electrostatic protection circuit and its peripheral circuits so as to explain a second modification of the semiconductor device according to the first embodiment of the present invention.

FIG. 3 is a circuit diagram showing an electrostatic protection circuit and its peripheral circuits so as to explain a second modification of the semiconductor device according to the first embodiment of the present invention. In the first embodiment, only the gate potential of the buffer NMOSFET 16 is controlled. In the second modification, the gate potential of the buffer PMOSFET 15 is also controlled.

More specifically, a prebuffer 26 includes, e.g., a 3-input NAND circuit 27 and inverter circuits 28 and 29. The prebuffer 26 serves as a control circuit to control the gate potential of the buffer PMOSFET 15. The external input terminal 14 is connected to the first input terminal of the 3-input NAND circuit 27. The second and third input terminals receive the gate potential control signal GC and enable signal EN, respectively. The 3-input NAND circuit 27 supplies its output signal to the input terminal of the inverter circuit 28. The inverter circuit 28 supplies its output to the input terminal of the inverter circuit 29. The inverter circuit 29 supplies its output to the gate of the buffer PMOSFET 15. The 3-input NAND circuit 27 and inverter circuits 28 and 29 operate at a voltage between the power supply potential VDD applied to the power supply terminal 11 and the reference potential VSS applied to the reference potential terminal 13.

According to the above-described arrangement, in the normal operation mode, the power supply potential VDD is applied to the external input terminal 14 so that the gate potentials of the MOSFETs 15 and 16 are controlled to a potential corresponding to the signals GC and EN. Upon positive ESD surge application, the external input terminal 14 is fixed to the reference potential VSS because it capacitively couples to the reference potential terminal 13. Accordingly, the gates of the buffer MOSFETs 15 and 16 are fixed to the source potential, and they are forcibly turned off. In this state, the parasitic BJT of the GGNMOSFET 18 is turned on to lead the ESD surge to the reference potential terminal 13 (reference potential VSS). This prevents the buffer NMOSFET 16 from breaking down at a potential lower than that of the GGNMOSFET 18.

When a negative ESD surge is applied, the parasitic diode of the SGPMOSFET 17 operates to lead the ESD surge to the power supply terminal 11 (power supply potential VDD). In this modification, the buffer PMOSFET 15 is forcibly turned off at this time. This prevents the buffer PMOSFET 15 from breaking down at a potential lower than that of the SGPMOSFET 17.

It is possible to effectively protect the output buffer from positive and negative ESD surges.

Two cases have been exemplified above. In one case, the gate potential of the buffer NMOSFET 16 which pulls down the potential of the I/O terminal 12 is controlled. In the other case, the gate potentials of both the buffer MOSFETs 15 and 16 which pull down/up the potential of the I/O terminal 12 are controlled. However, the circuit may be designed to fix only the gate potential of the buffer PMOSFET 15 which pulls up the potential of the I/O terminal 12 to the source potential of the MOSFET 15 upon ESD surge application. This prevents the buffer PMOSFET 15 from breaking down at a potential lower than that of the SGPMOSFET 17 connected in parallel to it when a negative ESD surge is applied to the I/O terminal 12.

(Third Modification)

Figure 4:
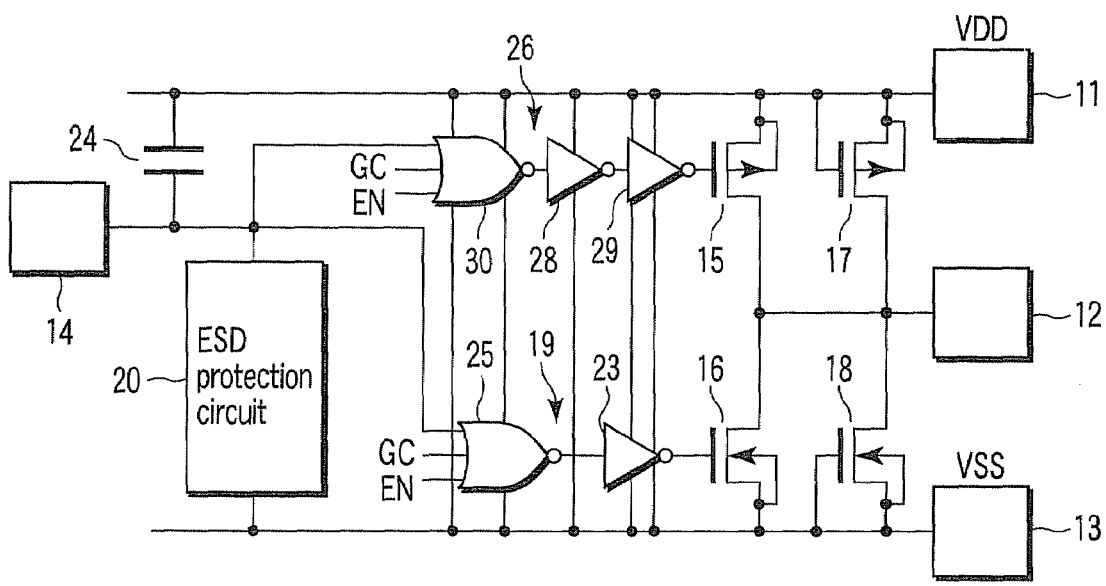
FIG. 4 is a circuit diagram showing an electrostatic protection circuit and its peripheral circuits so as to explain a third modification of the semiconductor device according to the first embodiment of the present invention.

FIG. 4 is a circuit diagram showing an electrostatic protection circuit and its peripheral circuits so as to explain a third modification of the semiconductor device according to the first embodiment of the present invention. The third modification is a combination of the first and second modifications.

More specifically, the external input terminal 14 capacitively couples to the power supply terminal 11 via the capacitive element 24. In the normal operation mode, the reference potential VSS is applied to the external input terminal 14. The 3-input NOR circuit 25 is provided in place of the 3-input NAND circuit 22. Additionally, the prebuffer 26 is provided. The prebuffer 26 includes, e.g., a 3-input NOR circuit 30 and the inverter circuits 28 and 29. The prebuffer 26 serves as a control circuit to control the gate potential of the buffer PMOSFET 15. The external input terminal 14 is connected to the first input terminal of the 3-input NOR circuit 30. The second and third input terminals receive the gate potential control signal GC and enable signal EN, respectively. The 3-input NOR circuit 30 supplies its output signal to the input terminal of the inverter circuit 28. The inverter circuit 28 supplies its output to the input terminal of the inverter circuit 29. The inverter circuit 29 supplies its output to the gate of the buffer PMOSFET 15. The 3-input NOR circuit 30 and inverter circuits 28 and 29 operate at a voltage between the power supply potential VDD applied to the power supply terminal 11 and the reference potential VSS applied to the reference potential terminal 13.

Even this arrangement can fundamentally provide the same function and effect as in the second modification.

Second Embodiment

Figure 5:
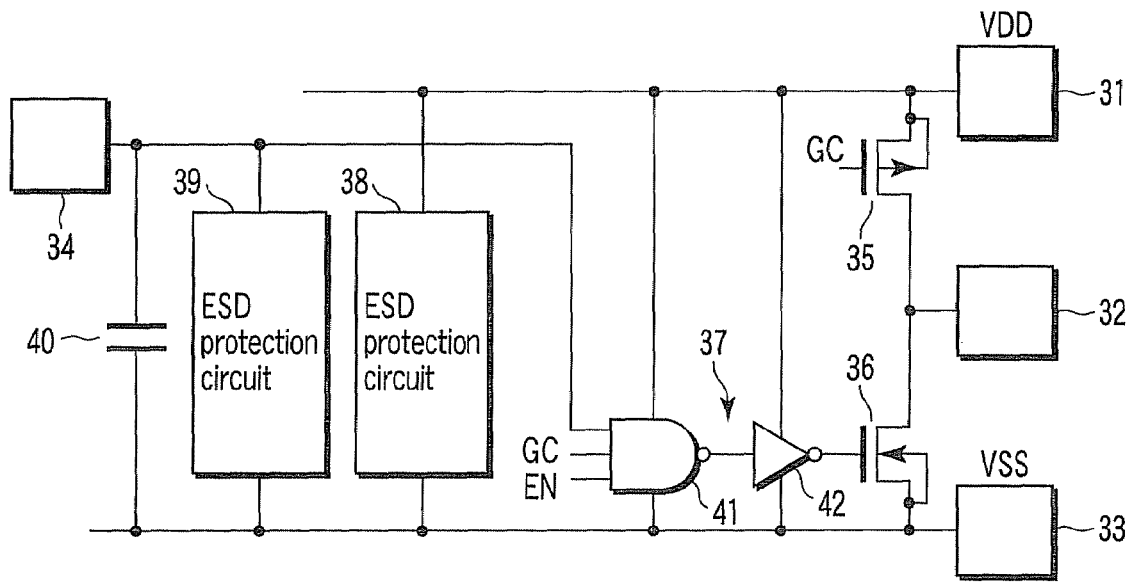
FIG. 5 is a circuit diagram showing an electrostatic protection circuit and its peripheral circuits so as to explain a semiconductor device according to the second embodiment of the present invention.

FIG. 5 is a circuit diagram showing an electrostatic protection circuit and its peripheral circuits so as to explain a semiconductor device according to the second embodiment of the present invention. FIG. 5 places focus on an output buffer, as in the first embodiment. This circuit includes a power supply terminal (VDD terminal) 31, I/O terminal 32, reference potential terminal (VSS terminal) 33, external input terminal 34, buffer PMOSFET 35, buffer NMOSFET 36, prebuffer 37, ESD protection circuits 38 and 39, and capacitive element 40.

A power supply potential VDD is applied to the power supply terminal 31. A reference potential VSS is applied to the reference potential terminal 33. The I/O terminal 32 inputs/outputs data. The buffer PMOSFET 35 and buffer NMOSFET 36 form an output buffer. The current path between the source and drain of the buffer PMOSFET 35 is connected between the power supply terminal 31 and the I/O terminal 32 to pull up the I/O terminal 32 to the power supply potential VDD. The current path between the source and drain of the buffer NMOSFET 36 is connected between the I/O terminal 32 and the reference potential terminal 33 to pull down the I/O terminal 32 to the reference potential VSS. The bulks (back gates) of the buffer PMOSFET 35 and buffer NMOSFET 36 are connected to their sources.

The prebuffer 37 includes, e.g., a 3-input NAND circuit 41 and an inverter circuit 42. The prebuffer 37 serves as a control circuit to control the gate potential of the buffer NMOSFET 36. The external input terminal 34 is connected to the first input terminal of the 3-input NAND circuit 41. The second and third input terminals receive a gate potential control signal GC and an enable signal EN, respectively.

The gate potential control signal GC is also supplied to the gate of the buffer PMOSFET 35. The signal GC and enable signal EN are generated by, e.g., the internal circuit.

The external input terminal 34 capacitively couples to the reference potential terminal 33 via the capacitive element 40. In the normal operation mode, the power supply potential VDD is applied to the external input terminal 34. The ESD protection circuit 38 is connected between the power supply terminal 31 and the reference potential terminal 33. The ESD protection circuit 38 has an arrangement capable of removing positive and negative ESD surges. As the ESD protection circuit 38, for example, an arrangement shown in FIG. 6 to be described later is used.

The ESD protection circuit 39 is connected between the external input terminal 34 and the reference potential terminal 33. The ESD protection circuit 39 has an arrangement capable of removing positive and negative ESD surges. The ESD protection circuit 39 includes, e.g., a GGNMOSFET.

Figure 6:
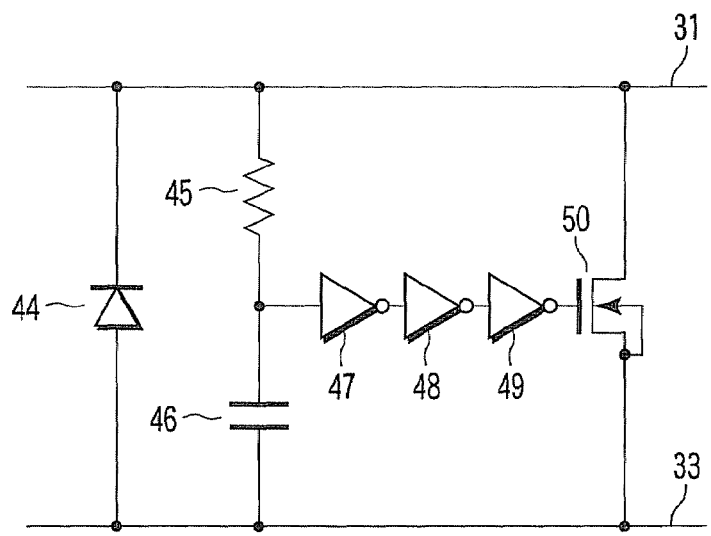
FIG. 6 is a circuit diagram showing an arrangement example of an ESD protection circuit in the circuit shown in FIG. 5.

FIG. 6 is a circuit diagram showing an arrangement example of the ESD protection circuit 38 in the circuit shown in FIG. 5. The ESD protection circuit 38 includes a diode 44, resistive element 45, capacitive element 46, inverter circuits 47, 48, and 49, and NMOSFET 50. The cathode of the diode 44 is connected to the power supply terminal 31, and the anode is connected to the reference potential terminal 33. The resistive element 45 and capacitive element 46 are connected in series between the power supply terminal 31 and the reference potential terminal 33. The inverter circuit 47 has an input terminal connected to the node between the resistive element 45 and the capacitive element 46 and an output terminal connected to the input terminal of the inverter circuit 48. The output terminal of the inverter circuit 48 is connected to the input terminal of the inverter circuit 49. The NMOSFET 50 serves as an inter-power-supply protection element. The current path of the NMOSFET 50 is connected between the power supply terminal 31 and the reference potential terminal 33. The gate of the NMOSFET 50 is connected to the output terminal of the inverter circuit 49.

According to the arrangement shown in FIG. 6, in the steady state, the input terminal of the inverter circuit 47 is set to the power supply potential VDD. The output of the inverter circuit 49 is set to the reference potential VSS. Hence, the NMOSFET 50 is OFF. When a positive ESD surge is applied to the power supply terminal 31, a transient current flows between the resistive element 45 and the capacitive element 46. The input terminal of the inverter circuit 47 is set to the reference potential VSS, and the output of the inverter circuit 49 is set to the power supply potential VDD. Hence, the NMOSFET 50 is turned on and leads the ESD surge to the reference potential terminal 33.

When a negative ESD surge is applied to the power supply terminal 31, the diode 44 executes the protective operation.

In the circuit with the arrangement shown in FIGS. 5 and 6, the power supply potential VDD is applied to the external input terminal 34 in the normal operation mode. Hence, the prebuffer 37 controls the NMOSFET 36 on the basis of the signal GC and enable signal EN. The buffer PMOSFET 35 is ON/OFF-controlled on the basis of the signal GC complementarily to the buffer NMOSFET 36.

When a positive ESD surge relative to, e.g., the reference potential terminal 33 is applied to the I/O terminal 32, the power supply terminal 31 is stepped up to a potential higher than the reference potential terminal 33 via a diode parasitic on the buffer PMOSFET 35. The level of the signal GC and enable signal EN is fixed to the power supply potential VDD, reference potential VSS, or an intermediate potential between them depending on the state of the control circuit. Generally, the state to be set is unpredictable.

At this time, the external input terminal 34 is fixed to the reference potential VSS upon ESD surge application because it capacitively couples to the reference potential terminal 33. Upon receiving a signal of reference potential VSS from the external input terminal 34, the prebuffer 37 including the 3-input NAND circuit 41 and inverter circuit 42 fixes the gate potential of the buffer NMOSFET 36 to the reference potential VSS. This allows to forcibly turn off the buffer NMOSFET 36 upon ESD surge application. The ESD surge is led to the reference potential VSS via the parasitic diode of the buffer PMOSFET 35 and the ESD protection circuit 39.

When the above-described control circuit is used, the breakdown voltage of the buffer NMOSFET 36 can be raised as compared to a case without control. Accordingly, an operating voltage Vt1 of the inter-power-supply protection element (NMOSFET 50) can be designed high. It is possible to effectively prevent an operation error of the protection circuit in the normal operation mode by designing the high operating voltage Vt1 for the inter-power-supply protection element.

(First Modification)

FIG. 7 is a circuit diagram showing an electrostatic protection circuit and its peripheral circuits so as to explain a first modification of the semiconductor device according to the second embodiment of the present invention. In the second embodiment, the external input terminal 34 capacitively couples to the reference potential terminal 33 via the capacitive element 40. In the first modification, the external input terminal 34 capacitively couples to the power supply terminal 31 via a capacitive element 51. In the normal operation mode, the reference potential VSS is applied to the external input terminal 34. Additionally, a 3-input NOR circuit 52 is provided in place of the 3-input NAND circuit 41.

The remaining basic components are the same as in the second embodiment. The same reference numerals as in the second embodiment denote the same parts in this modification, and a detailed description thereof will not be repeated.

According to the above-described arrangement, in the normal operation mode, the reference potential VSS is applied to the external input terminal 34 so that the gate potential of the buffer NMOSFET 36 is controlled to a potential corresponding to the signals GC and EN. Upon ESD surge application, the external input terminal 34 is fixed to the power supply potential VDD because it capacitively couples to the power supply terminal 31. Accordingly, the gate of the buffer NMOSFET 36 is fixed to the source potential, and the buffer NMOSFET 36 is forcibly turned off. In this state, the ESD surge is led to the reference potential VSS via the parasitic diode of the buffer PMOSFET 35 and the ESD protection circuit 39. This prevents the buffer NMOSFET 36 from breaking down at a potential lower than that of the GGN-MOSFET 38.

It is therefore possible to fundamentally execute the same operation and actually obtain the same function and effect as in the second embodiment.

(Second Modification)

FIG. 8 is a circuit diagram showing an electrostatic protection circuit and its peripheral circuits so as to explain a second modification of the semiconductor device according to the second embodiment of the present invention. In the second embodiment, only the gate potential of the buffer NMOSFET 36 is controlled. In the second modification, the gate potential of the buffer PMOSFET 35 is also controlled.

More specifically, a prebuffer 53 includes, e.g., a 3-input NAND circuit 54 and inverter circuits 55 and 56. The prebuffer 53 serves as a control circuit to control the gate potential of the buffer PMOSFET 35. The external input terminal 34 is connected to the first input terminal of the 3-input NAND circuit 54. The second and third input terminals receive the gate potential control signal GC and enable signal EN, respectively. The 3-input NAND circuit 54 supplies its output signal to the input terminal of the inverter circuit 55. The inverter circuit 55 supplies its output to the input terminal of the inverter circuit 56. The inverter circuit 56 supplies its output to the gate of the buffer PMOSFET 35. The 3-input NAND circuit 54 and inverter circuits 55 and 56 operate at a voltage between the power supply potential VDD applied to the power supply terminal 31 and the reference potential VSS applied to the reference potential terminal 33.

According to the above-described arrangement, in the normal operation mode, the power supply potential VDD is applied to the external input terminal 34 so that the gate potentials of the MOSFETs 35 and 36 are controlled to a potential corresponding to the signals GC and EN. Upon positive ESD surge application, the external input terminal 34 is fixed to the reference potential VSS because it capacitively couples to the reference potential terminal 33. Accordingly, the gates of the buffer MOSFETs 35 and 36 are fixed to the source potential, and they are forcibly turned off. In this state, the parasitic diode of the buffer PMOSFET 35 is turned on to lead the ESD surge to the reference potential terminal 33 (reference potential VSS) via the ESD protection circuit 38.

In this modification, when a negative ESD surge is applied to the I/O terminal 32, the buffer PMOSFET 35 is forcibly turned off. The parasitic diode of the buffer NMOSFET 36 is turned on to lead the ESD surge to the power supply terminal 11 (power supply potential VDD) via the ESD protection circuit 38.

It is therefore possible to effectively protect the internal circuit from positive and negative ESD surges.

(Third Modification)

Figure 9:
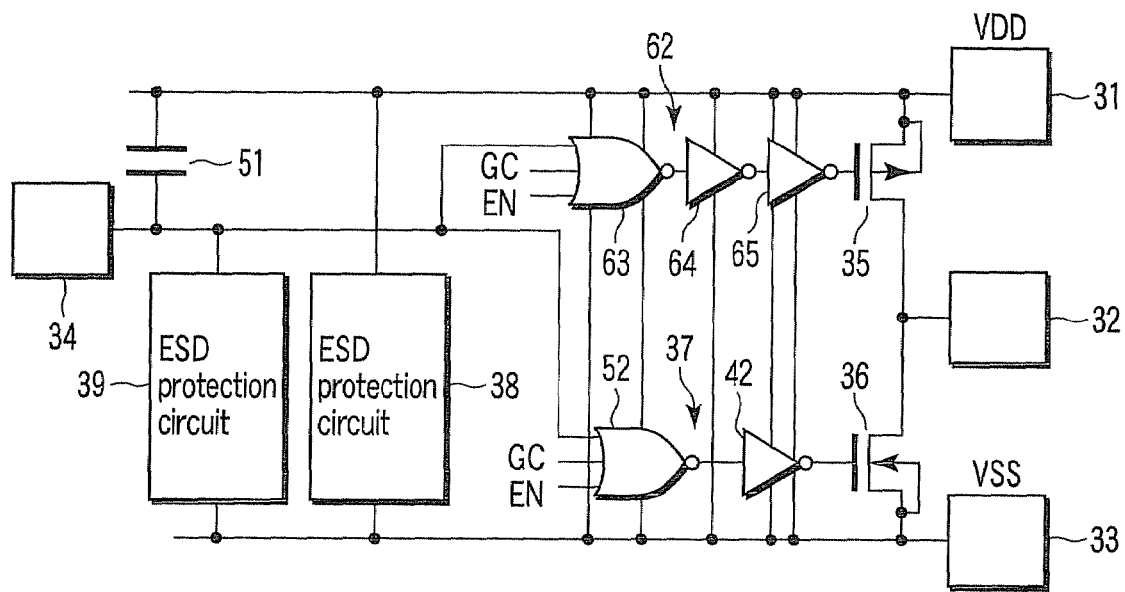
FIG. 9 is a circuit diagram showing an electrostatic protection circuit and its peripheral circuits so as to explain a third modification of the semiconductor device according to the second embodiment of the present invention.

FIG. 9 is a circuit diagram showing an electrostatic protection circuit and its peripheral circuits so as to explain a third modification of the semiconductor device according to the second embodiment of the present invention. The third modification is a combination of the first and second modifications.

More specifically, the external input terminal 34 capacitively couples to the power supply terminal 31 via the capacitive element 51. In the normal operation mode, the reference potential VSS is applied to the external input terminal 34. The 3-input NOR circuit 52 is provided in place of the 3-input NAND circuit 41. Additionally, a prebuffer 62 is provided. The prebuffer 62 includes, e.g., a 3-input NOR circuit 63 and the inverter circuits 64 and 65. The prebuffer 62 serves as a control circuit to control the gate potential of the buffer PMOSFET 35. The external input terminal 34 is connected to the first input terminal of the 3-input NOR circuit 63. The second and third input terminals receive the gate potential control signal GC and enable signal EN, respectively. The 3-input NOR circuit 63 supplies its output signal to the input terminal of the inverter circuit 64. The inverter circuit 64 supplies its output to the input terminal of the inverter circuit 65. The inverter circuit 65 supplies its output to the gate of the buffer PMOSFET 35. The 3-input NOR circuit 63 and inverter circuits 64 and 65 operate at a voltage between the power supply potential VDD applied to the power supply terminal 31 and the reference potential VSS applied to the reference potential terminal 33.

This arrangement can also fundamentally provide the same function and effect as in the second modification.

(Fourth Modification)

Figure 10:
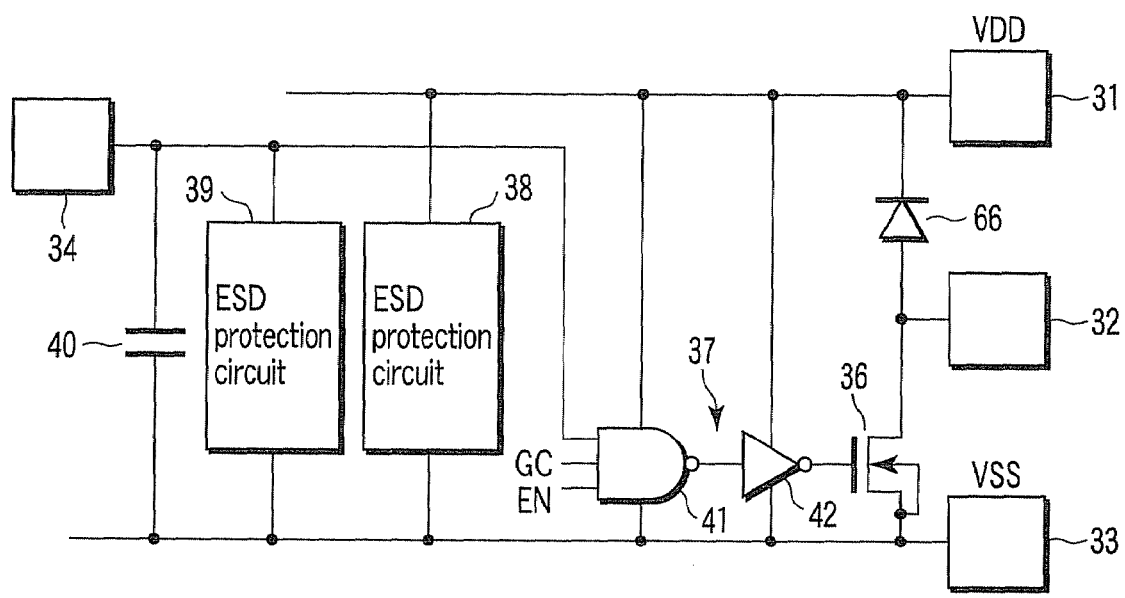
FIG. 10 is a circuit diagram showing an electrostatic protection circuit and its peripheral circuits so as to explain a fourth modification of the semiconductor device according to the second embodiment of the present invention.

FIG. 10 is a circuit diagram showing an electrostatic protection circuit and its peripheral circuits so as to explain a fourth modification of the semiconductor device according to the second embodiment of the present invention. This circuit includes a diode 66 in place of the buffer PMOSFET 35 in the circuit shown in FIG. 5. The cathode of the diode 66 is connected to the power supply terminal 31, and the anode is connected to the I/O terminal 32.

The basic protective operation is almost the same as that of the circuit shown in FIG. 5.

However, the circuit shown in FIG. 10 cannot pull up the I/O terminal 32 and is therefore applicable when the power supply potential VDD is applied to the I/O terminal 32.

(Fifth Modification)

Figure 11:
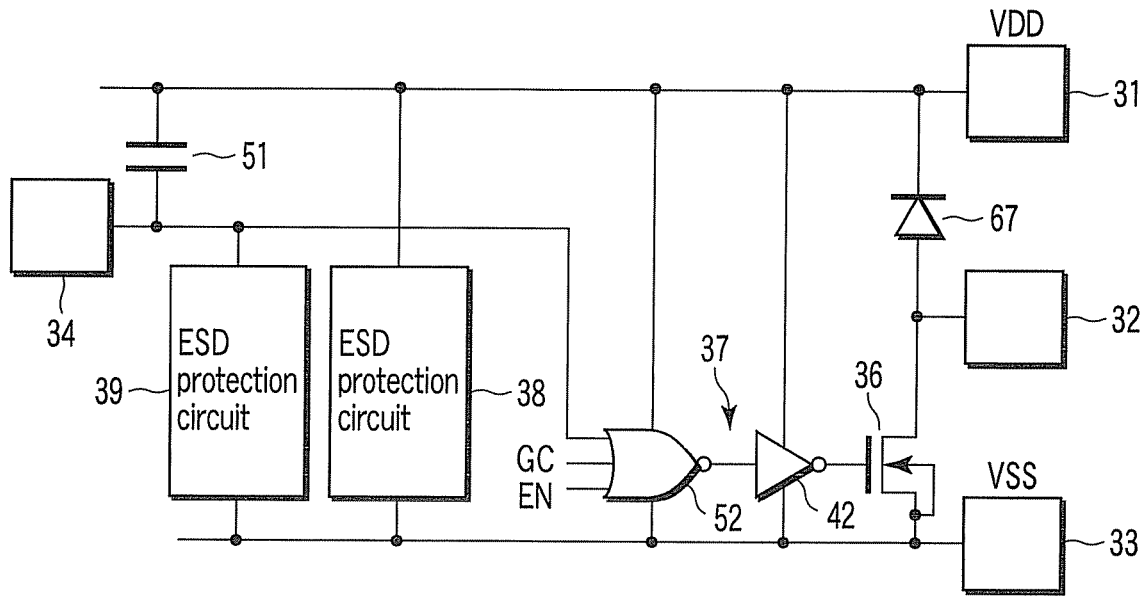
FIG. 11 is a circuit diagram showing an electrostatic protection circuit and its peripheral circuits so as to explain a fifth modification of the semiconductor device according to the second embodiment of the present invention.

FIG. 11 is a circuit diagram showing an electrostatic protection circuit and its peripheral circuits so as to explain a fifth modification of the semiconductor device according to the second embodiment of the present invention. This circuit includes a diode 67 in place of the buffer PMOSFET 35 in the circuit shown in FIG. 7. The cathode of the diode 67 is connected to the power supply terminal 31, and the anode is connected to the I/O terminal 32.

The basic protective operation is almost the same as that of the circuit shown in FIG. 7.

However, the circuit shown in FIG. 11 cannot pull up the I/O terminal 32 and is therefore applicable when the power supply potential VDD is applied to the I/O terminal 32, like the circuit shown in FIG. 10.

Third Embodiment

Figure 12:
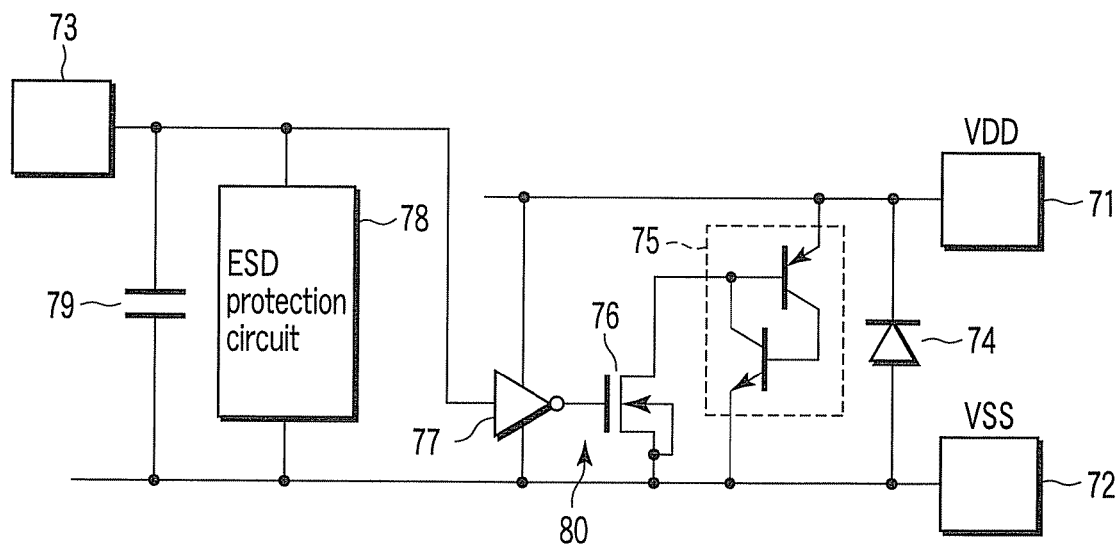
FIG. 12 is a circuit diagram showing an electrostatic protection circuit and its peripheral circuits so as to explain a semiconductor device according to the third embodiment of the present invention.

FIG. 12 is a circuit diagram showing an electrostatic protection circuit and its peripheral circuits so as to explain a semiconductor device according to the third embodiment of the present invention. The circuit of the third embodiment is a protection circuit that protects against an ESD surge applied to the power supply terminal. The third embodiment uses a thyristor as a protection element and is applied to trigger control of the thyristor.

This circuit includes a power supply terminal (VDD terminal) 71, reference potential terminal (VSS terminal) 72, external input terminal 73, diode 74, thyristor 75, NMOSFET 76, inverter circuit 77, ESD protection circuit 78, and capacitive element 79.

A power supply potential VDD is applied to the power supply terminal 71. A reference potential VSS is applied to the reference potential terminal 72. The cathode of the diode 74 is connected to the power supply terminal 71, and the anode is connected to the reference potential terminal 72. The anode of the thyristor 75 is connected to the power supply terminal 71, and the cathode is connected to the reference potential terminal 72. The drain of the NMOSFET 76 is connected to the gate of the thyristor 75, and the source and bulk (back gate) are connected to the reference potential terminal 72.

The inverter circuit 77 operates on the basis of a voltage between the power supply terminal 71 and the reference potential terminal 72. The inverter circuit 77 has an input terminal connected to the external input terminal 73 and an output terminal connected to the gate of the NMOSFET 76. The NMOSFET 76 and inverter circuit 77 serve as a trigger circuit 80 which supplies a trigger current to the thyristor 75.

The external input terminal 73 capacitively couples to the reference potential terminal 72 via the capacitive element 79. In the normal operation mode, the power supply potential VDD is applied to the external input terminal 73. The ESD protection circuit 78 is connected between the external input terminal 73 and the reference potential terminal 72. The ESD protection circuit 78 has an arrangement capable of removing positive and negative ESD surges. The ESD protection circuit 78 includes, e.g., a GGNMOSFET.

According to the above-described arrangement, in the normal operation mode, the power supply potential VDD is applied to the external input terminal 73. Hence, the output of the inverter circuit 77 is set to the reference potential VSS, and the NMOSFET 76 is OFF.

When a positive ESD surge is applied to the power supply terminal 71, the external input terminal 73 is fixed to the reference potential VSS because it capacitively couples to the reference potential terminal 72. This sets the output of the inverter circuit 77 to the power supply potential VDD and turns on the NMOSFET 76. A trigger current flows to the thyristor 75. The thyristor 75 is turned on to remove the ESD surge applied to the power supply terminal 71. Upon negative ESD surge application, not the thyristor 75 but the diode 74 executes the protective operation.

The external input terminal 73 is not connected to the power supply terminal in an LSI package but may be connected outside the package. When the power supply terminal and external input terminal 73 are connected outside the package, and an ESD surge is applied to the node between them, the above-described trigger circuit does not operate. However, since the ESD protection circuit 78 is connected to the external input terminal 73, a discharge route is ensured.

(Modification)

Figure 13:
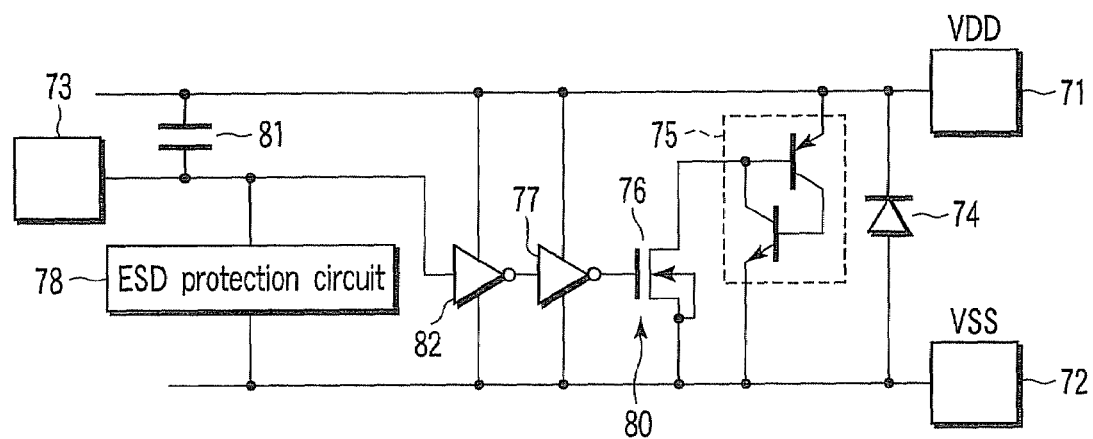
FIG. 13 is a circuit diagram showing an electrostatic protection circuit and its peripheral circuits so as to explain a modification of the semiconductor device according to the third embodiment of the present invention.

FIG. 13 is a circuit diagram showing an electrostatic protection circuit and its peripheral circuits so as to explain a modification of the semiconductor device according to the third embodiment of the present invention. This circuit has a capacitive element 81 between the external input terminal 73 and the power supply terminal 71. The trigger circuit 80 includes two stages of inverter circuits 82 and 77 and the NMOSFET 76.

The basic protective operation is almost the same as that of the circuit shown in FIG. 12, and a detailed description thereof will not be repeated.

Fourth Embodiment

Figure 14:
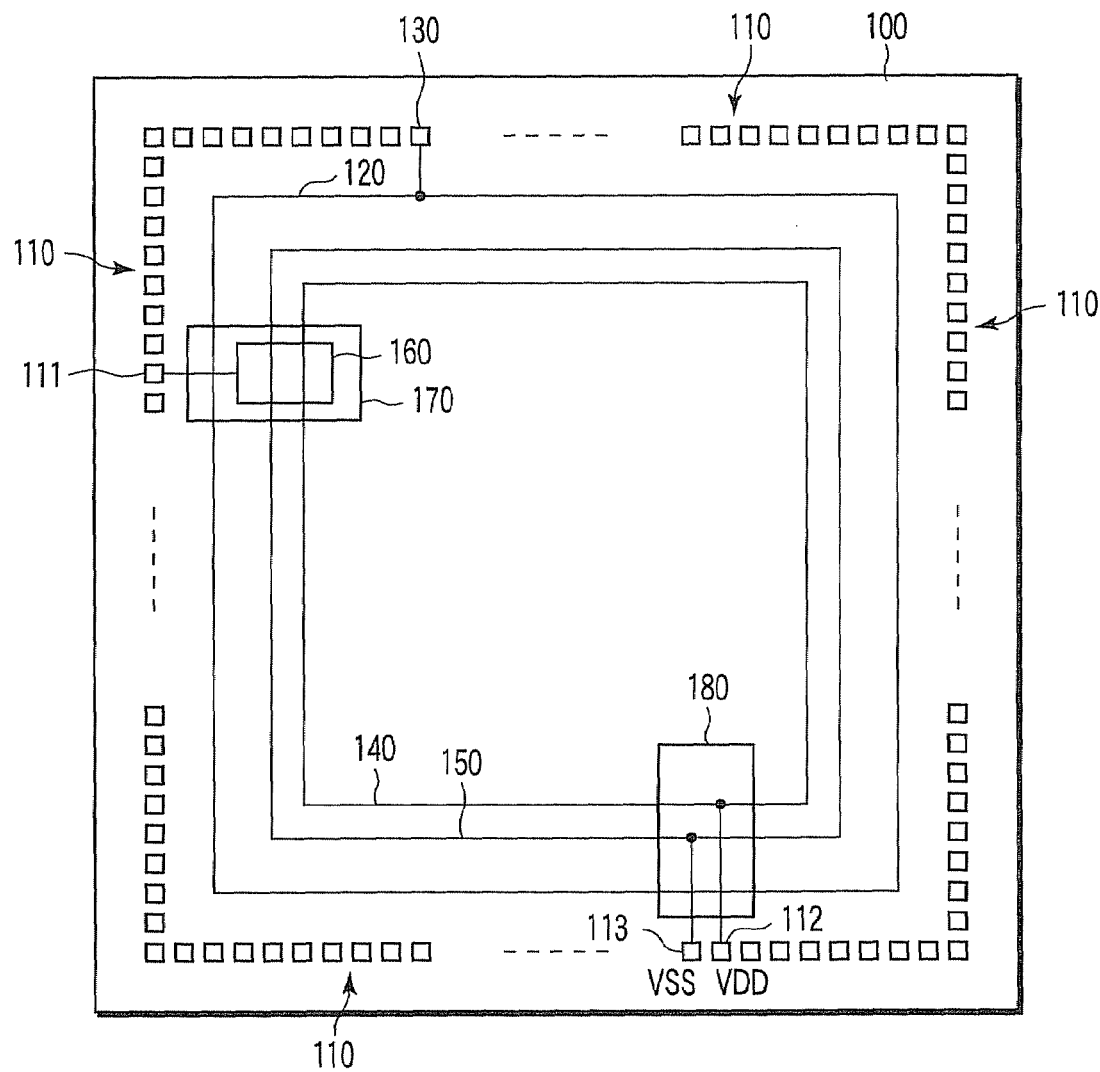
FIG. 14 is a circuit diagram schematically showing the arrangement of a chip mainly including electrostatic protection circuits and their peripheral circuits so as to explain a semiconductor device according to the fourth embodiment of the present invention.

FIG. 14 is a circuit diagram schematically showing the arrangement of a chip mainly including electrostatic protection circuits and their peripheral circuits so as to explain a semiconductor device according to the fourth embodiment of the present invention.

Pad arrays 110 are arranged along the four sides of a semiconductor chip 100. An interconnection 120 (control signal ring) is arranged along the periphery of the chip 100. An external input terminal 130 is connected to the interconnection 120. The interconnection 120 capacitively couples to a reference potential or power supply. Hence, in the normal operation mode, a power supply potential VDD or reference potential VSS is applied to the external input terminal 130. A power supply interconnection 140 and a reference potential interconnection 150 are arranged along the periphery of the chip 100. The interconnections 140 and 150 for supplying a power to the internal circuit are connected to a power supply terminal (power supply pad) 112 and a reference potential terminal (reference potential pad) 113, respectively.

The pad arrays 110 include the power supply terminal 112, reference potential terminal 113, and I/O terminal (I/O pad) 111. ESD protection circuits having the same arrangements as in the semiconductor devices according to the above-described first to third embodiments are selectively provided. The plurality of ESD protection circuits provided in the semiconductor chip 100 share the single external input terminal 130.

A buffer circuit 160 is connected to the power supply interconnection 140 and reference potential interconnection 150. The buffer circuit 160 operates on the basis of a voltage between the power supply interconnection 140 and the reference potential interconnection 150 and inputs/outputs data via the I/O terminal 111. The buffer circuit 160 includes an ESD protection circuit 170 which protects the buffer circuit 160 from an ESD surge applied to the I/O terminal 111. The ESD protection circuit 170 has a control circuit. The control circuit is connected to the external input terminal 130 via the interconnection 120. In the normal operation mode, the control circuit controls the buffer circuit 160 on the basis of the power supply potential VDD (or reference potential VSS). Upon ESD surge application, the external input terminal 130 is fixed to the reference potential VSS (or power supply potential VDD) due to capacitive coupling. Hence, the buffer circuit 160 is fixed to the reference potential VSS or power supply potential VDD and disabled.

That is, the ESD protection circuit 170 is connected to the power supply interconnection 140 and reference potential interconnection 150 and has an arrangement according to one of, e.g., the first and second embodiments and their modifications.

The remaining I/O terminals also have an ESD protection circuit.

An ESD protection circuit 180 is designed to protect the internal circuit from an ESD surge applied to the power supply terminal 112 and reference potential terminal 113. The ESD protection circuit 180 has a trigger circuit. The trigger circuit is connected to the external input terminal 130. In the normal operation mode, the trigger circuit disables the ESD protection circuit 180 on the basis of the power supply potential VDD (or reference potential VSS) applied to the external input terminal 130. Upon ESD surge application, the external input terminal 130 is fixed to the reference potential VSS (or power supply potential VDD) due to capacitive coupling, thereby giving trigger to the ESD protection circuit 180 and operating it.

The ESD protection circuit 180 is connected to the power supply interconnection 140 and reference potential interconnection 150 and has an arrangement according to one of, e.g., the third embodiment and its modification.

According to this arrangement, it is possible to cause the plurality of ESD protection circuits to share the external input terminal and effectively protect the internal circuit.

As described above, according to one aspect of this invention, a semiconductor device capable of effectively protecting an internal circuit from electrostatic breakdown can be provided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a first terminal which receives a first potential;
   a second terminal which receives a second potential different from the first potential;
   an I/O terminal which inputs/outputs data;
   a first buffer MOSFET of a first conductivity type, which has a current path connected between the first terminal and the I/O terminal and drives the I/O terminal by the first potential;
   a second buffer MOSFET of a second conductivity type, which has a current path connected between the I/O terminal and the second terminal and drives the I/O terminal by the second potential;
   a first ESD protection circuit configured to protect an internal circuit from an ESD surge;
   an external input terminal which capacitively couples to one of the second terminal and the first terminal and receives one of the first potential and the second potential in a normal operation mode; and
   a control circuit including a first prebuffer which is configured to receive a signal that controls a gate potential of each of the first buffer MOSFET and the second buffer MOSFET, control a gate of each of the first buffer MOSFET and the second buffer MOSFET to a potential corresponding to the signal in the normal operation mode on the basis of one of the first potential and the second potential applied to the external input terminal, and fix the external input terminal to one of the second potential and the first potential by capacitive coupling upon ESD surge application, thereby fixing the gate of the second buffer MOSFET to one of the second potential and the first potential and turning off the second buffer MOSFET, in which the first prebuffer includes a 3-input NAND circuit which operates at a voltage between the first potential applied to the first terminal and the second potential applied to the second terminal and has a first input terminal connected to the external input terminal, and second and third input terminals which receive a gate potential control signal and an enable signal, respectively, and an inverter circuit which operates at a voltage between the first potential applied to the first terminal and the second potential applied to the second terminal and causes an input terminal to receive an output signal from the 3-input NAND circuit and an output terminal to supply an inverted signal to the gate of the second buffer MOSFET, and which further comprises a capacitive element which is connected between the second terminal and the external input terminal to make the second terminal capacitively couple to the external input terminal.

2. A device according to claim 1, wherein the first ESD protection circuit protects the internal circuit from the ESD surge applied to the I/O terminal.

3. A device according to claim 2, wherein the first ESD protection circuit includes at least one of a grounded gate N-channel MOSFET and a source connected gate P-channel MOSFET.

4. A device according to claim 1, wherein the first ESD protection circuit includes a protection MOSFET of the first conductivity type whose gate and one end of a current path are connected to the first terminal and whose other end of the current path is connected to the I/O terminal, and a protection MOSFET of the second conductivity type whose gate and one end of a current path are connected to the second terminal and whose other end of the current path is connected to the I/O terminal.

5. A device according to claim 1, wherein
the first ESD protection circuit is provided between the first terminal and the second terminal, and
the ESD surge applied to the I/O terminal is led to the second terminal via a current path of the first buffer MOSFET and the first ESD protection circuit.

6. A device according to claim 1, wherein the control circuit further includes a second prebuffer which is configured to fix the external input terminal to one of the second potential and the first potential by capacitive coupling upon ESD surge application, thereby fixing the gate of the first buffer MOSFET to one of the first potential and the second potential and turning off the first buffer MOSFET.

7. A device according to claim 1, wherein the first potential is applied to the external input terminal in the normal operation mode.

8. A device according to claim 1, further comprising a second ESD protection circuit connected between the external input terminal and the second terminal.

9. A semiconductor device comprising:
a first terminal which receives a first potential;
a second terminal which receives a second potential different from the first potential;
an I/O terminal which inputs/outputs data;
a first buffer MOSFET of a first conductivity type, which has a current path connected between the first terminal and the I/O terminal and drives the I/O terminal by the first potential;
a second buffer MOSFET of a second conductivity type, which has a current path connected between the I/O terminal and the second terminal and drives the I/O terminal by the second potential;
a first ESD protection circuit configured to protect an internal circuit from an ESD surge;
an external input terminal which capacitively couples to one of the second terminal and the first terminal and receives one of the first potential and the second potential in a normal operation mode; and
a control circuit including a first prebuffer which is configured to receive a signal that controls a gate potential of each of the first buffer MOSFET and the second buffer MOSFET, control a gate of each of the first buffer MOSFET and the second buffer MOSFET to a potential corresponding to the signal in the normal operation mode on the basis of one of the first potential and the second potential applied to the external input terminal, and fix the external input terminal to one of the second potential and the first potential by capacitive coupling upon ESD surge application, thereby fixing the gate of the second buffer MOSFET to one of the second potential and the first potential and turning off the second buffer MOSFET, in which the first prebuffer includes a 3-input NOR circuit which operates at a voltage between the first potential applied to the first terminal and the second potential applied to the second terminal and has a first input terminal connected to the external input terminal, and second and third input terminals which receive a gate potential control signal and an enable signal, respectively, and an inverter circuit which operates at a voltage between the first potential applied to the first terminal and the second potential applied to the second terminal and causes an input terminal to receive an output signal from the 3-input NOR circuit and an output terminal to supply an inverted signal to the gate of the second buffer MOSFET, and which further comprises a capacitive element which is connected between the first terminal and the external input terminal to make the first terminal capacitively couple to the external input terminal.

10. A device according to claim 9, wherein the second potential is applied to the external input terminal in the normal operation mode.

11. A device according to claim 6, wherein the second prebuffer includes a 3-input NAND circuit which operates at a voltage between the first potential applied to the first terminal and the second potential applied to the second terminal and has a first input terminal connected to the external input terminal, and second and third input terminals which receive a gate potential control signal and an enable signal, respectively, and an inverter circuit which operates at a voltage between the first potential applied to the first terminal and the second potential applied to the second terminal and causes an input terminal to receive an output signal from the 3-input NAND circuit and an output terminal to supply an inverted signal to the gate of the second buffer MOSFET.

12. A semiconductor device comprising:
a first terminal which receives a first potential;
a second terminal which receives a second potential different from the first potential;
an I/O terminal which inputs/outputs data;

a first buffer MOSFET of a first conductivity type, which has a current path connected between the first terminal and the I/O terminal and drives the I/O terminal by the first potential;

a second buffer MOSFET of a second conductivity type, which has a current path connected between the I/O terminal and the second terminal and drives the I/O terminal by the second potential;

a first ESD protection circuit configured to protect an internal circuit from an ESD surge;

an external input terminal which capacitively couples to one of the second terminal and the first terminal and receives one of the first potential and the second potential in a normal operation mode; and a control circuit including a first prebuffer which is configured to receive a signal that controls a gate potential of each of the first buffer MOSFET and the second buffer MOSFET, control a gate of each of the first buffer MOSFET and the second buffer MOSFET to a potential corresponding to the signal in the normal operation mode on the basis of one of the first potential and the second potential applied to the external input terminal, and fix the external input terminal to one of the second potential and the first potential by capacitive coupling upon ESD surge application, thereby fixing the pate of the second buffer MOSFET to one of the second potential and the first potential and turning off the second buffer MOSFET, wherein the second prebuffer includes a 3-input NOR circuit which operates at a voltage between the first potential applied to the first terminal and the second potential applied to the second terminal and has a first input terminal connected to the external input terminal, and second and third input terminals which receive a gate potential control signal and an enable signal, respectively, and an inverter circuit which operates at a voltage between the first potential applied to the first terminal and the second potential applied to the second terminal and causes an input terminal to receive an output signal from the 3-input NOR circuit and an output terminal to supply an inverted signal to the gate of the second buffer MOSFET.

13. A device according to claim 9, wherein the first ESD protection circuit protects the internal circuit from the ESD surge applied to the I/O terminal.

14. A device according to claim 13, wherein the first ESD protection circuit includes at least one of a grounded gate N-channel MOSFET and a source connected gate P-channel MOSFET.

15. A device according to claim 9, wherein the first ESD protection circuit includes a protection MOSFET of the first conductivity type whose gate and one end of a current path are connected to the first terminal and whose other end of the current path is connected to the I/O terminal, and a protection MOSFET of the second conductivity type whose gate and one end of a current path are connected to the second terminal and whose other end of the current path is connected to the I/O terminal.

16. A device according to claim 9, wherein
the first ESD protection circuit is provided between the first terminal and the second terminal, and
the ESD surge applied to the I/O terminal is led to the second terminal via a current path of the first buffer MOSFET and the first ESD protection circuit.

17. A device according to claim 12, wherein the first ESD protection circuit protects the internal circuit from the ESD surge applied to the I/O terminal.

18. A device according to claim 17, wherein the first ESD protection circuit includes at least one of a grounded gate N-channel MOSFET and a source connected gate P-channel MOSFET.

19. A device according to claim 12, wherein the first ESD protection circuit includes a protection MOSFET of the first conductivity type whose gate and one end of a current path are connected to the first terminal and whose other end of the current path is connected to the I/O terminal, and a protection MOSFET of the second conductivity type whose gate and one end of a current path are connected to the second terminal and whose other end of the current path is connected to the I/O terminal.

20. A device according to claim 12, wherein
the first ESD protection circuit is provided between the first terminal and the second terminal, and
the ESD surge applied to the I/O terminal is led to the second terminal via a current path of the first buffer MOSFET and the first ESD protection circuit.

* * * * *